US011682607B2

(12) United States Patent
We et al.

(10) Patent No.: US 11,682,607 B2
(45) Date of Patent: Jun. 20, 2023

(54) PACKAGE HAVING A SUBSTRATE COMPRISING SURFACE INTERCONNECTS ALIGNED WITH A SURFACE OF THE SUBSTRATE

(71) Applicant: QUALCOMM Incorporated, San Diego, CA (US)

(72) Inventors: Hong Bok We, San Diego, CA (US); Marcus Hsu, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 144 days.

(21) Appl. No.: 17/164,729

(22) Filed: Feb. 1, 2021

(65) Prior Publication Data
US 2022/0246496 A1 Aug. 4, 2022

(51) Int. Cl.
| | |
|---|---|
| *H01L 21/00* | (2006.01) |
| *H01L 23/48* | (2006.01) |
| *H01L 21/768* | (2006.01) |
| *H01L 23/00* | (2006.01) |

(52) U.S. Cl.
CPC ...... *H01L 23/481* (2013.01); *H01L 21/76898* (2013.01); *H01L 24/14* (2013.01); *H01L 24/81* (2013.01); *H01L 2224/1403* (2013.01); *H01L 2224/1412* (2013.01); *H01L 2224/14051* (2013.01)

(58) Field of Classification Search
CPC .. H01L 23/481; H01L 21/76898; H01L 24/14
See application file for complete search history.

(56) References Cited

U.S. PATENT DOCUMENTS

| | | | | |
|---|---|---|---|---|
| 8,837,872 | B2* | 9/2014 | Yang | G02B 6/43 |
| | | | | 385/129 |
| 8,853,754 | B2* | 10/2014 | Lin | H01L 27/14618 |
| | | | | 257/E51.027 |
| 9,142,527 | B2* | 9/2015 | Lee | H01L 24/05 |
| 9,153,555 | B2* | 10/2015 | Lee | H01L 24/05 |
| 9,343,369 | B2* | 5/2016 | Du | H01L 21/76895 |
| 9,369,175 | B2* | 6/2016 | Lee | H04B 1/7113 |

(Continued)

FOREIGN PATENT DOCUMENTS

| | | | | |
|---|---|---|---|---|
| EP | | 3108499 B1 * | 9/2021 | ......... H01L 21/4853 |
| WO | WO-2021112978 A1 * | | 6/2021 | ............ H01L 21/56 |

(Continued)

OTHER PUBLICATIONS

International Search Report and Written Opinion—PCT/US2021/064920—ISA/EPO—dated Apr. 12, 2022.

*Primary Examiner* — Laura M Menz
(74) *Attorney, Agent, or Firm* — Loza & Loza, LLP

(57) ABSTRACT

A package that includes a substrate and an integrated device. The substrate includes at least one dielectric layer, a plurality of interconnects comprising a first material, and a plurality of surface interconnects coupled to the plurality of interconnects. The plurality of surface interconnects comprises a second material. A surface of the plurality of surface interconnects is planar with a surface of the substrate. The integrated device is coupled to the plurality of surface interconnects of the substrate through a plurality of pillar interconnects and a plurality of solder interconnects.

16 Claims, 12 Drawing Sheets

PROFILE VIEW

(56) References Cited

U.S. PATENT DOCUMENTS

| | | | |
|---|---|---|---|
| 9,391,021 B2* | 7/2016 | Lin | H01L 21/6835 |
| 9,425,174 B1 | 8/2016 | Hin et al. | |
| 9,461,008 B2* | 10/2016 | Kumar | H01L 24/11 |
| 9,508,637 B2* | 11/2016 | Chen | H01L 23/49811 |
| 11,031,310 B2* | 6/2021 | Lin | H01L 24/11 |
| 11,444,019 B2* | 9/2022 | Patil | H01L 23/5389 |
| 2014/0035095 A1 | 2/2014 | Lin et al. | |
| 2015/0194379 A1* | 7/2015 | Chen | H01L 21/4853 |
| | | | 257/668 |
| 2015/0235991 A1* | 8/2015 | Gu | H01L 25/105 |
| | | | 174/262 |
| 2015/0333056 A1* | 11/2015 | Du | H01L 27/0688 |
| | | | 257/773 |
| 2021/0175152 A1* | 6/2021 | Zhang | H01L 23/552 |
| 2021/0175178 A1* | 6/2021 | We | H01L 21/565 |
| 2021/0210452 A1* | 7/2021 | Langari | H01L 23/49827 |
| 2021/0313266 A1* | 10/2021 | Patil | H01L 24/16 |
| 2021/0351145 A1* | 11/2021 | Patil | H01L 24/19 |
| 2022/0167334 A1* | 5/2022 | Brandl | B60Q 1/268 |
| 2022/0246496 A1* | 8/2022 | We | H01L 21/76898 |
| 2022/0310488 A1* | 9/2022 | Fang | H01L 21/4853 |
| 2022/0320026 A1* | 10/2022 | Sun | H01L 24/92 |
| 2022/0328417 A1* | 10/2022 | Patil | H01L 23/49833 |

FOREIGN PATENT DOCUMENTS

| | | | | |
|---|---|---|---|---|
| WO | WO-2022164560 A1 * | 8/2022 | | H01L 21/76898 |
| WO | WO-2022203804 A1 * | 9/2022 | | H01L 23/482 |
| WO | WO-2022203810 A1 * | 9/2022 | | H01L 23/16 |

* cited by examiner

PROFILE VIEW

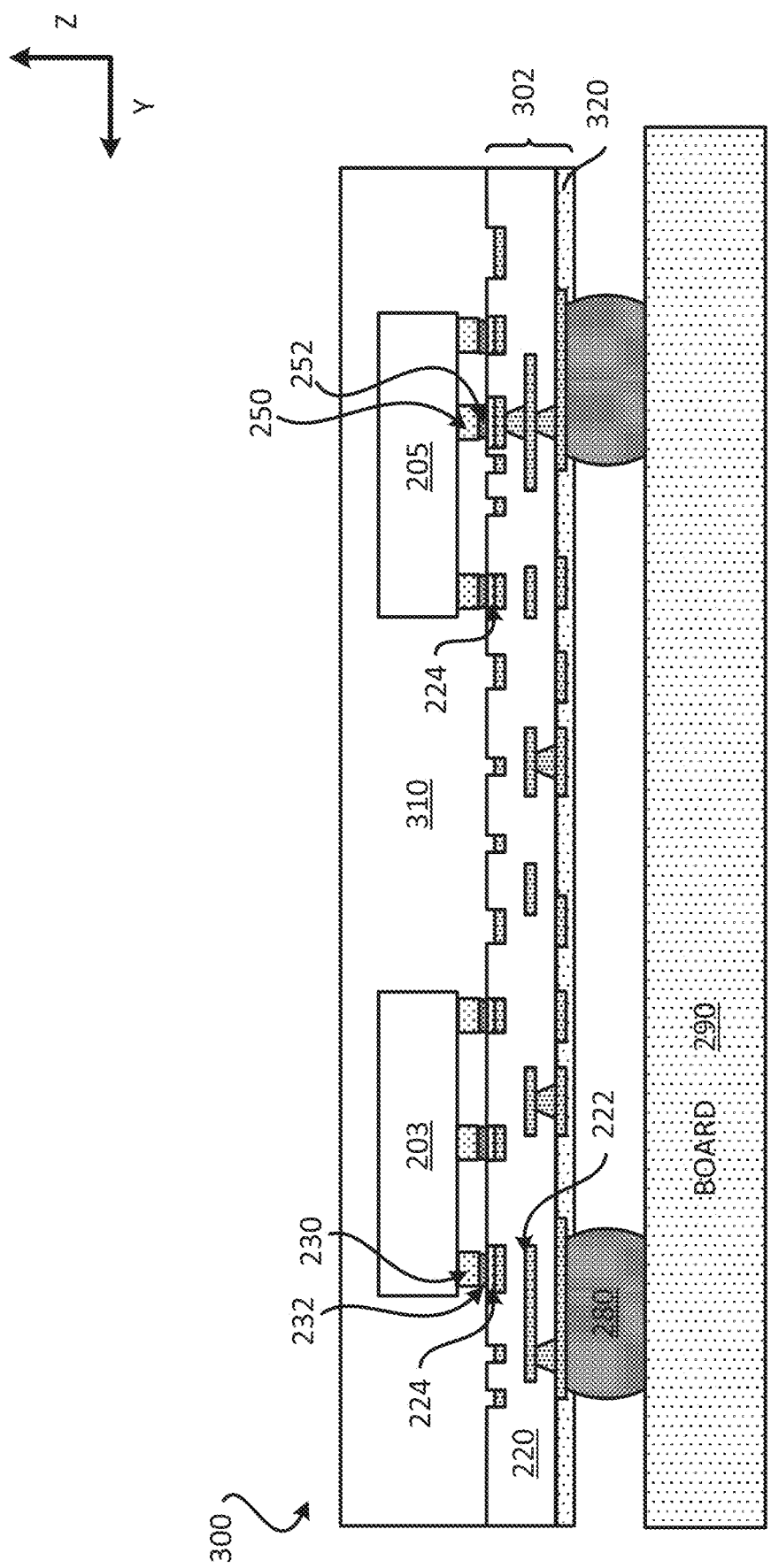

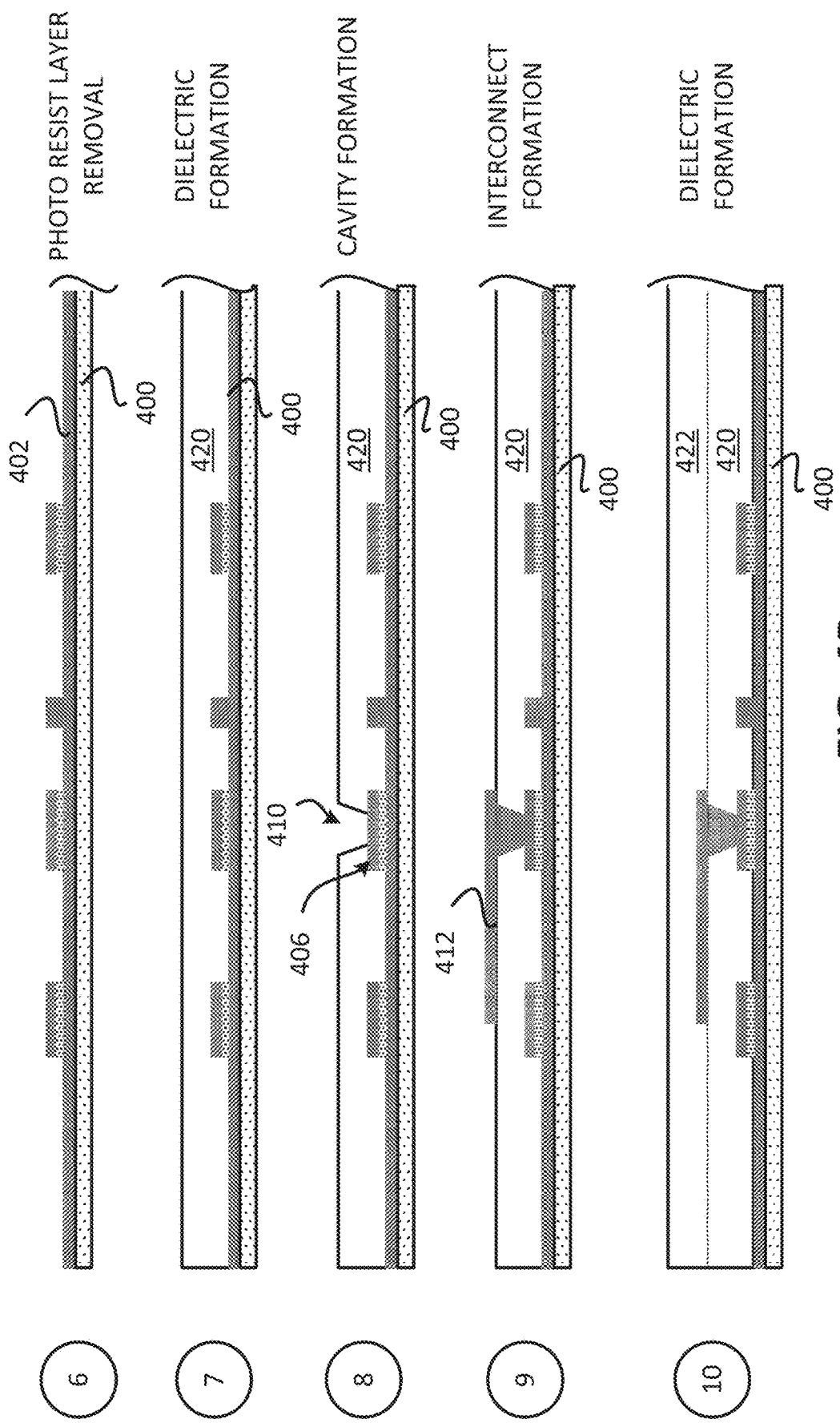

PACKAGE HAVING A SUBSTRATE COMPRISING SURFACE INTERCONNECTS ALIGNED WITH A SURFACE OF THE SUBSTRATE

FIELD

Various features relate to packages that include an integrated device, but more specifically to a package that includes an integrated device and a substrate.

BACKGROUND

A substrate includes a dielectric layer and a plurality of interconnects. Some substrate fabrication processes will produce surface interconnects with surface recesses, where surface interconnects will be embedded in the substrate and located below the surface of the substrate. These surface recesses in the substrate may cause poor or bad solder joints between the surface interconnects and an integrated device that is coupled to the substrate. Poor and/or bad solder joints in a package can cause reliability issues in the package. There is an ongoing need to provide more reliable packages.

SUMMARY

Various features relate to packages that include an integrated device, but more specifically to a package that includes an integrated device and a substrate.

One example provides a package that includes a substrate and an integrated device. The substrate includes at least one dielectric layer, a plurality of interconnects comprising a first material, and a plurality of surface interconnects coupled to the plurality of interconnects. The plurality of surface interconnects comprises a second material. A surface of the plurality of surface interconnects is planar with a surface of the substrate. The integrated device is coupled to the plurality of surface interconnects of the substrate through a plurality of pillar interconnects and a plurality of solder interconnects.

Another example provides a substrate includes at least one dielectric layer, a plurality of interconnects comprising a first material, and a plurality of surface interconnects coupled to the plurality of interconnects. The plurality of surface interconnects comprises a second material. A surface of the plurality of surface interconnects is planar with a surface of the substrate.

Another example provides a method for fabricating a package. The method provides a substrate comprising at least one dielectric layer, a plurality of interconnects comprising a first material, and a plurality of surface interconnects coupled to the plurality of interconnects. The plurality of surface interconnects comprises a second material. A surface of the plurality of surface interconnects is planar with a surface of the substrate. The method couples an integrated device to the plurality of surface interconnects of the substrate through a plurality of pillar interconnects and a plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a profile view of another package that includes a substrate comprising surface interconnects aligned with a surface of the substrate.

FIGS. 4A-4D illustrate an exemplary sequence for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device. The substrate includes at least one dielectric layer, a plurality of interconnects comprising a first material, and a plurality of surface interconnects coupled to the plurality of interconnects. The plurality of surface interconnects comprises a second material. A surface of the plurality of surface interconnects is planar with a surface of the substrate. The integrated device is coupled to the plurality of surface interconnects of the substrate through a plurality of pillar interconnects and a plurality of solder interconnects. The plurality of surface interconnects (e.g., surface pad interconnect) helps provide reliable and strong solder joints between an integrated device and the substrate, even when there is a misalignment of the integrated device when the integrated device is coupled to the substrate.

Exemplary Package Comprising a Substrate Comprising Surface Interconnects

Figure 1:
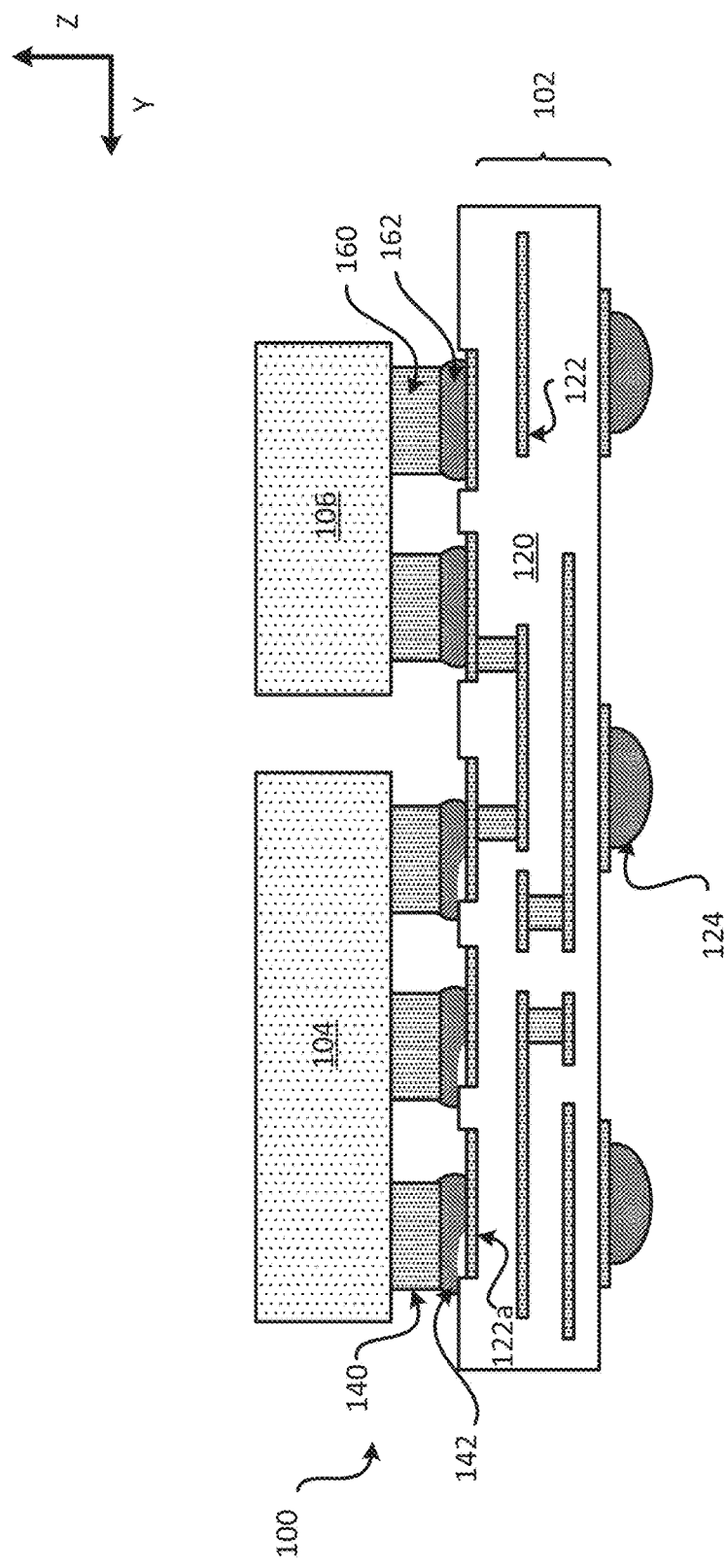
FIG. 1 illustrates a profile view of a package that includes integrated devices and a substrate.

FIG. 1 illustrates a package 100 that includes a substrate 102, an integrated device 104 and integrated device 106. The substrate 102 includes at least one dielectric layer 120 and a plurality of interconnects 122. The plurality of interconnects 122 includes interconnects that are embedded in the substrate 102. The integrated device 104 is coupled to the substrate 102 through a plurality of pillar interconnects 140 and a plurality of solder interconnects 142. The plurality of solder interconnects 142 is coupled to the plurality of interconnects 122. The integrated device 106 is coupled to the substrate 102 through a plurality of pillar interconnects 160 and a plurality of solder interconnects 162. The plurality of solder interconnects 162 is coupled to the plurality of interconnects 122. A plurality of solder interconnects 124 is coupled to the substrate 102.

The integrated device 104 is misaligned with interconnects of the substrate 102. As a result, part of the plurality of pillar interconnects 140 and part of the plurality of solder interconnects 142 are not aligned with pad interconnects (e.g., 122a) of the substrate 102. This results in poor or bad solder joints between the solder interconnect (e.g., 142) and the pad interconnects (e.g., 122a), as the vertical offset between the pad interconnect and a top surface of the substrate 102 stretches the solder interconnect and/or creates one or more small voids in the solder interconnect 142, resulting in a poor or bad electrical connection between the integrated device 104 and the substrate 102.

Figure 2:
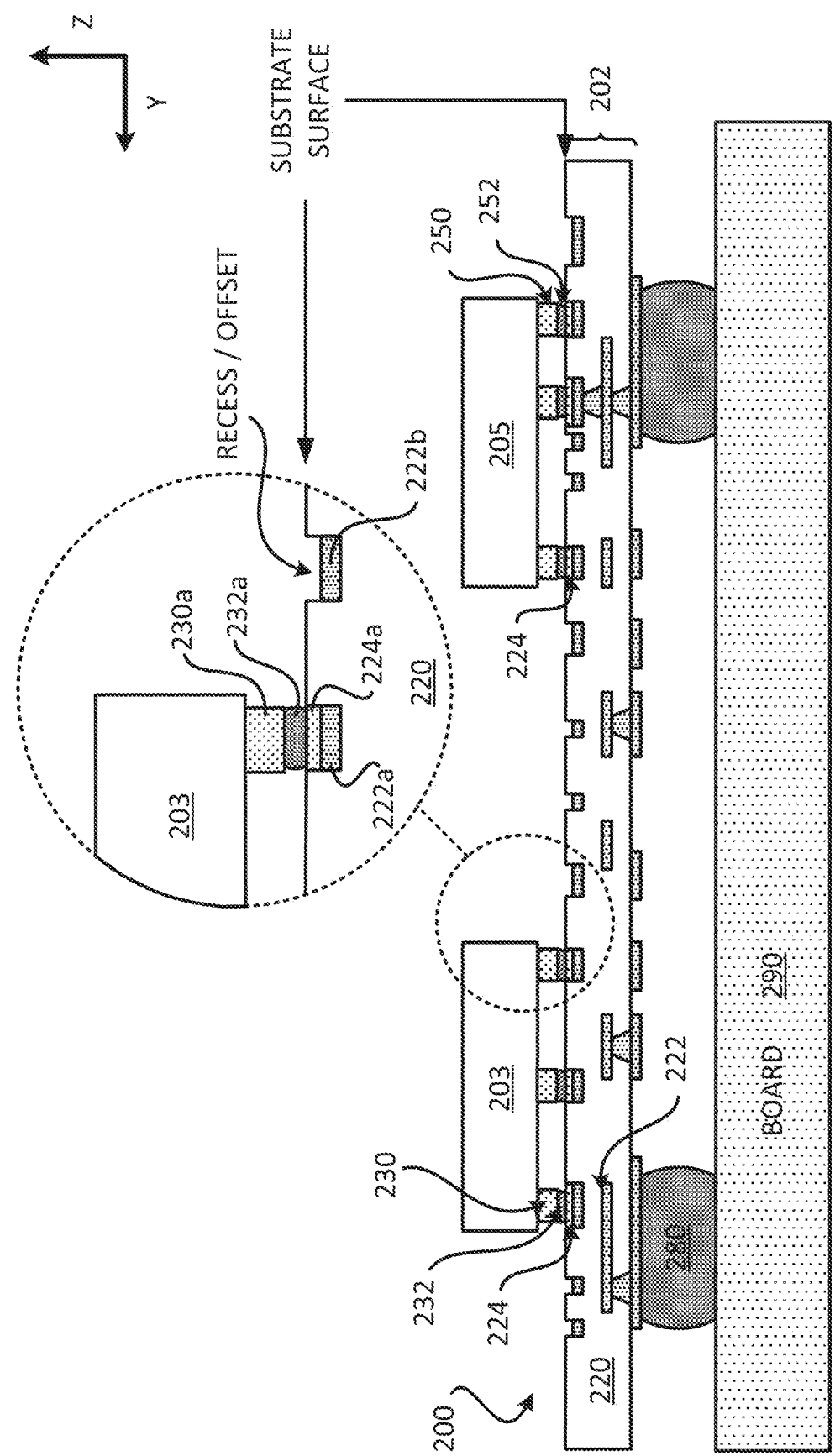
FIG. 2 illustrates a profile view of a package that includes a substrate comprising surface interconnects aligned with a surface of the substrate.

FIG. 2 illustrates a profile view of a package 200 that includes a substrate with surface interconnects. The package 200 includes a substrate 202, an integrated device 203 and an integrated device 205. The package 200 is coupled to a board 290 (e.g., printed circuit board (PCB)) through a plurality of solder interconnects 280. The integrated device 203 is coupled to the substrate 202 through the plurality of pillar interconnects 230 and the plurality of solder interconnects 232. The integrated device 205 is coupled to the substrate 202 through the plurality of pillar interconnects 250 and the plurality of solder interconnects 252.

The substrate 202 may be an embedded trace substrate (ETS). The substrate 202 includes at least one dielectric layer 220, a plurality of interconnects 222 and a plurality of surface interconnects 224. The plurality of interconnects 222 includes interconnects located in the at least one dielectric layer 220. The plurality of interconnects 222 includes a plurality of interconnects (e.g., pad interconnect, trace interconnect) that are embedded through a surface of the substrate 202 and offset from the surface of the substrate 202. Examples of interconnects from the plurality of interconnects 222 include a pad interconnect 222a and a trace interconnect 222b. The plurality of interconnects 222 that are offset from the surface of the substrate 202 may have a substrate recess located over the plurality of interconnects 222. The interconnect 222b (e.g., trace interconnect) is an example of an interconnect that is offset from the surface of the substrate 202 and is adjacent to a substrate recess.

The substrate 202 includes a plurality of surface interconnects 224. The plurality of surface interconnects 224 is coupled to some of the plurality of interconnects 222. The plurality of surface interconnects 224 may occupy a space that could otherwise be a substrate recess. The plurality of surface interconnects 224 include a different material than the plurality of interconnects 222. For example, the plurality of interconnects 222 may include copper, and the plurality of surface interconnects 224 may include tin (Sn). The plurality of surface interconnects 224 may be different from a seed layer (e.g., copper seed layer). The plurality of surface interconnects 224 may be free of a seed layer. The plurality of surface interconnects 224 may have a surface that is aligned and/or planar with a surface (e.g., first surface, top surface) of the substrate 202. For example, a surface of the plurality of surface interconnects 224 that faces away from the substrate 202 is aligned and/or planar with the surface (e.g., first surface, top surface) of the substrate 202. In another example, a surface of the plurality of surface interconnects 224 that faces away from the substrate 202 is aligned and/or planar with the surface (e.g., first surface, top surface) of the at least one dielectric layer 220. The surface of the plurality of surface interconnects 224 that faces away from the substrate 202 is a surface that faces an integrated device (e.g., 203, 205).

The plurality of surface interconnects 224 may be located on a different metal layer than any of the interconnects from the plurality of interconnects 222 of the substrate 202. The plurality of surface interconnects 224 may be the only interconnects that have a surface (e.g., surface facing away from the substrate) that is aligned and/or planar with a first surface (e.g., top surface, integrated device facing surface) of the substrate 202 (e.g., top surface of the at least one dielectric layer 220 of the substrate 202). The plurality of surface interconnects 224 is located between the plurality of interconnects 222 and at least one integrated device (e.g., 203, 205). The plurality of surface interconnects 224 may be a means for surface interconnection.

The plurality of surface interconnects 224 is coupled to some of the plurality of interconnects 222 so that a surface (e.g., surface facing away from substrate, surface facing an integrated device) of the plurality of surface interconnects is planar and/or aligned with the surface of the substrate 202. The plurality of surface interconnects 224 helps provide reliable and strong solder joints between an integrated device and the substrate, even when there is a misalignment of the integrated device when the integrated device is coupled to the substrate 202.

FIG. 2 illustrates that the integrated device 203 is configured to be electrically coupled to the substrate 202 through the plurality of pillar interconnects 230 and the plurality of solder interconnects 232. In particular, the integrated device 203 is configured to be electrically coupled to the plurality of surface interconnects 224 through the plurality of pillar interconnects 230 and the plurality of solder interconnects 232. The pillar interconnect 230a and the solder interconnect 232a may be considered part of the integrated device 203. The integrated device 203 is coupled to the pillar interconnect 230a. The pillar interconnect 230a is coupled to the solder interconnect 232a. The solder interconnect 232a is coupled to the surface interconnect 224a. The surface interconnect 224a is coupled to the interconnect 222a. The surface interconnect 224a is located over the interconnect 222a. The surface interconnect 224a may be a surface pad interconnect. The interconnect 222a may be a pad interconnect. Thus, a surface pad interconnect may be coupled (e.g., directly coupled) to a pad interconnect. The surface interconnect 224a and the interconnect 222a may be considered as a single pad interconnect comprising a first metal layer and a second metal layer, where the second metal layer includes a different material than a material of the first metal layer. The first metal layer may be represented by the interconnect 222a and the second metal layer may be represented by the surface interconnect 224a. The first metal layer may include copper, and the second metal layer may include tin (Sn). The first meal layer may include a seed layer.

Similarly, the integrated device 205 is configured to be electrically coupled to the substrate 202 through the plurality of pillar interconnects 250 and the plurality of solder interconnects 252. In particular, the integrated device 205 is configured to be electrically coupled to the plurality of surface interconnects 224 through the plurality of pillar interconnects 250 and the plurality of solder interconnects 252. The plurality of pillar interconnects 250, the plurality of solder interconnects 252, the plurality of surface interconnects 224 and the plurality of interconnects 222 may be coupled to each other, as described above for the plurality of pillar interconnects 230, the plurality of solder interconnects 232, the plurality of surface interconnects 224 and the plurality of interconnects 222, between the integrated device 203 and the substrate 202.

The integrated device (e.g., 203, 205) may include a die (e.g., semiconductor bare die). The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, a power management processor (e.g., power management integrated circuit), an application processor and/or combinations thereof. An integrated device (e.g., 203, 205) may include at least one electronic circuit (e.g., first electronic circuit, second electronic circuit, etc. . . . ).

It is noted that different packages may have different numbers of integrated devices. The location of the integrated devices is exemplary. The integrated devices may be coupled to different portions of the substrate.

FIG. 3 illustrates a profile view of a package 300 that includes a substrate 302 comprising surface interconnects. The package 300 is similar to the package 200. As such, the package 300 includes the same or similar components as the package 200. The substrate 302 is similar to the substrate 202. As such, the substrate 302 includes the same or similar components as the substrate 202. The substrate 302 may be an embedded trace substrate (ETS). The substrate 302 includes at least one dielectric layer 220, the plurality of interconnects 222, the plurality of surface interconnects 224, a solder resist layer 320 and an encapsulation layer 310.

The solder resist layer 320 is coupled to a bottom surface of the substrate 302. The encapsulation layer 310 may be formed and located over the first surface (e.g., top surface) of the substrate 302 and the integrated device(s) (e.g., 203, 205). The encapsulation layer 310 may include a mold, a resin and/or an epoxy. A compression molding process, a transfer molding process, or a liquid molding process may be used to form the encapsulation layer 310. The encapsulation layer 310 may be photo etchable. The encapsulation layer 310 may be a means for encapsulation.

Exemplary Sequence for Fabricating a Substrate

In some implementations, fabricating a substrate includes several processes. FIGS. 4A-4D illustrate an exemplary sequence for providing or fabricating a substrate that includes surface interconnects. In some implementations, the sequence of FIGS. 4A-4D may be used to provide or fabricate the substrate 202 of FIG. 2. However, the process of FIGS. 4A-4D may be used to fabricate any of the substrates described in the disclosure.

It should be noted that the sequence of FIGS. 4A-4D may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Figure 4A:
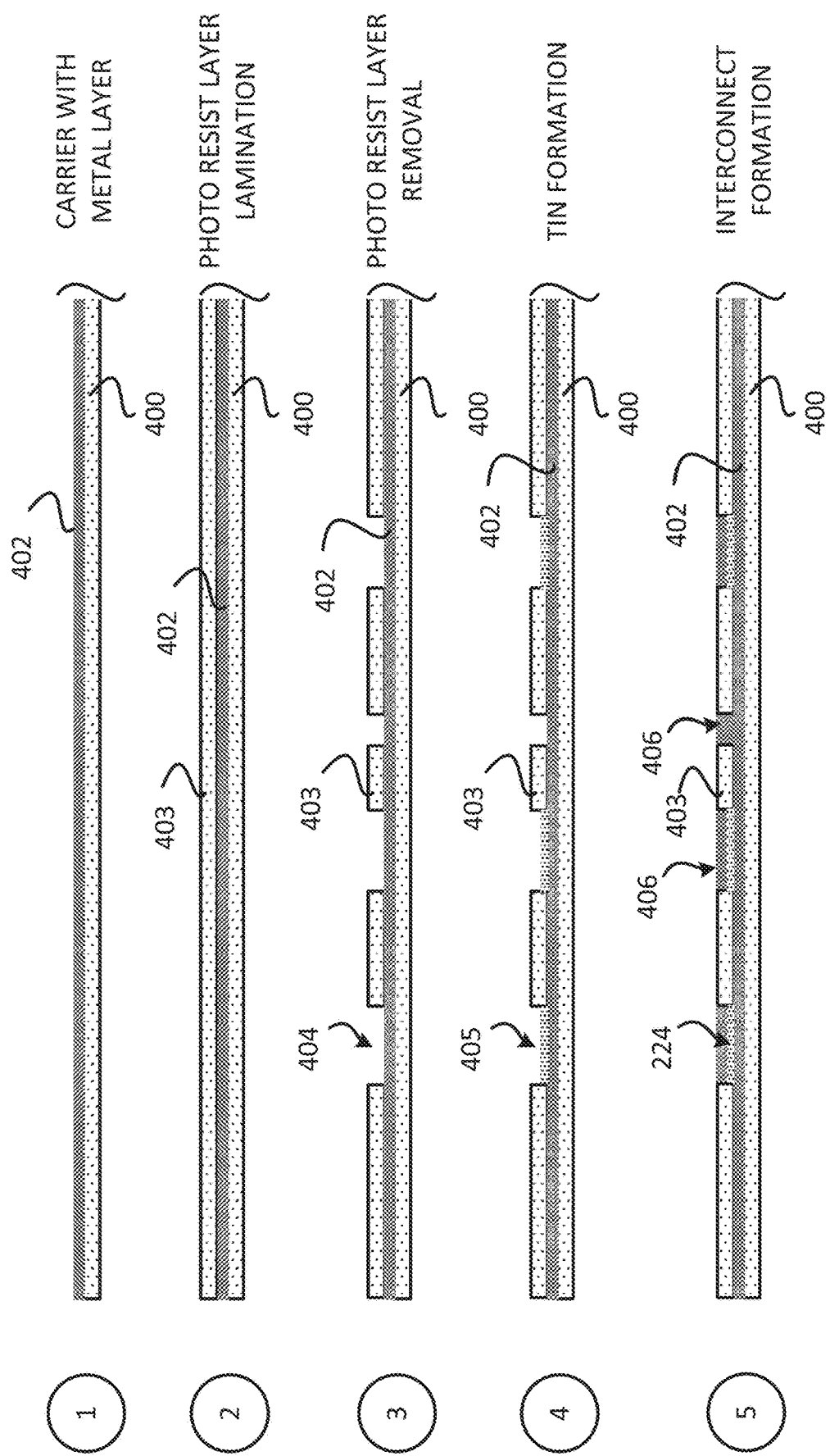

Stage 1, as shown in FIG. 4A, illustrates a state after a carrier 400 with a metal layer 402 is provided. The metal layer 402 may include a seed layer. The metal layer 402 may include copper.

Stage 2 illustrates a state after a photo resist layer 403 is provided. The photo resist layer 403 may be formed over the metal layer 402. A lamination process and/or deposition process may be used to form the photo resist layer 403.

Stage 3 illustrates a state after a selective etching of the photo resist layer 403, which results in openings 404 in the photo resist layer 403.

Stage 4 illustrates a state after a metal layer 405 is formed through the openings 404 of the photo resist layer 403. The metal layer 405 may form the plurality of surface interconnects 224, as described in the disclosure. The metal layer 405 may include tin (Sn). However, different material(s) may be used for the metal layer 405. A plating process may be used to form the metal layer 405. The metal layer 405 may be different than a seed layer (e.g., copper seed layer).

Stage 5 illustrates a state after interconnects 406 are formed over the metal layer 405 (e.g., surface interconnect 224) and the metal layer 402. A plating process may be used to form the interconnects. The interconnects 406 may include copper. The interconnects 406 may include a different material from the metal layer 405 and/or the surface interconnects 224).

Stage 6, as shown in FIG. 4B, illustrates a state after a removal of the photo resist layer 403, exposing the metal layer 402.

Stage 7 illustrates a state after a dielectric layer 420 is formed over the metal layer 402, the metal layer 405 and the carrier 400. The dielectric layer 420 may include polyimide. However, different implementations may use different materials for the dielectric layer. A deposition process and/or lamination process may be used to form the dielectric layer 420.

Stage 8 illustrates a state after a plurality of cavities 410 is formed in the dielectric layer 420. The plurality of cavities 410 may be formed using an etching process (e.g., photo etching process) or laser process. The plurality of cavities 410 may expose part of the interconnects 406.

Stage 9 illustrates a state after interconnects 412 are formed in and over the dielectric layer 420. The interconnects 412 may be formed in the plurality of cavities 410. Examples of interconnects that may be formed include a via, pad and/or trace. A plating process may be used to form the interconnects. The interconnects 412 may include copper.

Stage 10 illustrates a state after another dielectric layer 422 is formed over the dielectric layer 420. The dielectric layer 422 may be the same material as the dielectric layer 420. However, different implementations may use different materials for the dielectric layer. A deposition process and/or lamination process may be used to form the dielectric layer 422.

Figure 4C:
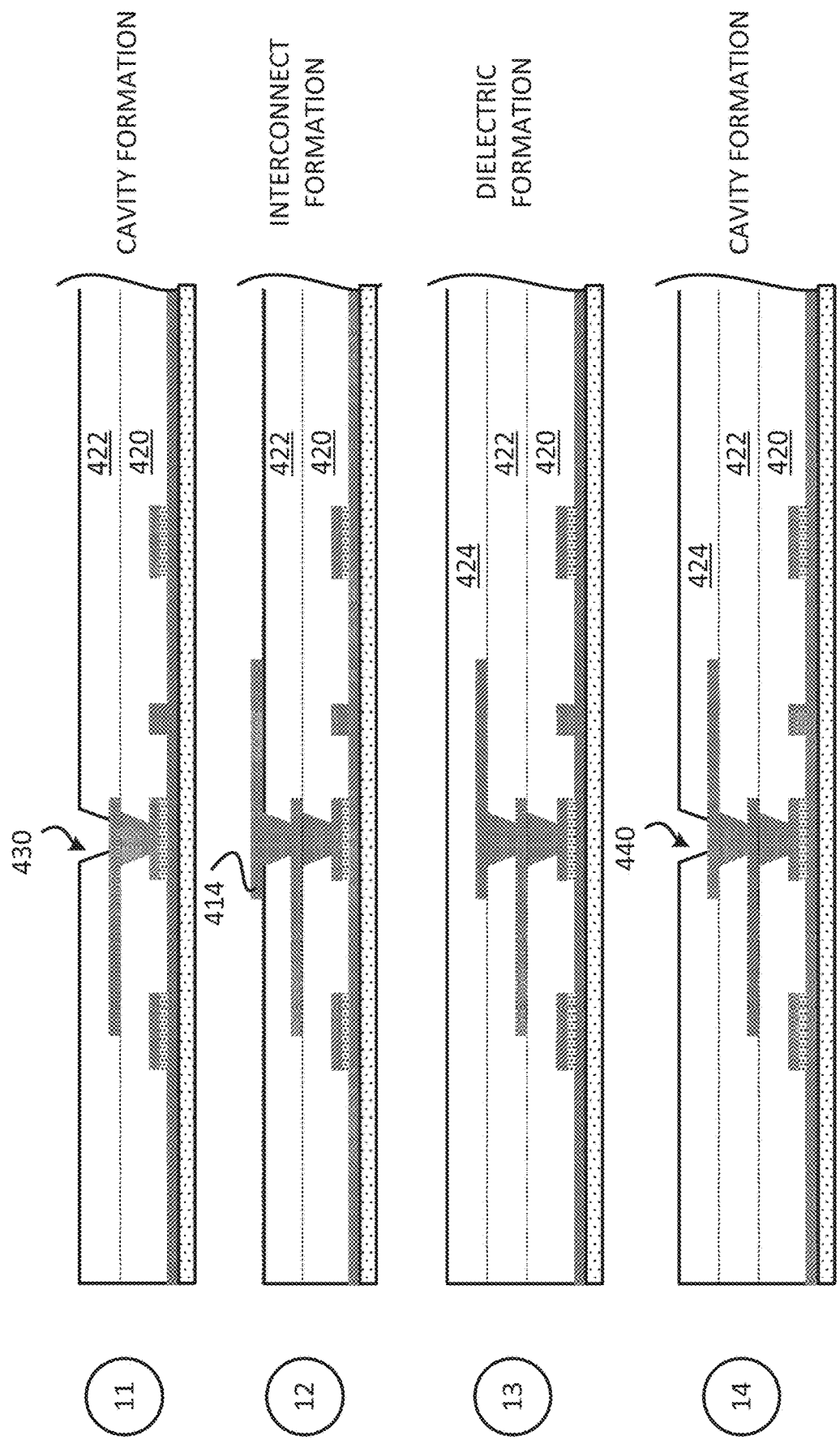

Stage 11, as shown in FIG. 4C, illustrates a state after a plurality of cavities 430 is formed in the dielectric layer 422. An etching process or laser process may be used to form the cavities 430. The plurality of cavities 430 may expose part of the interconnects 412.

Stage 12 illustrates a state after interconnects 414 are formed in and over the dielectric layer 422. The interconnects 414 may be formed in the plurality of cavities 430. Examples of interconnects that may be formed include a via, pad and/or trace. A plating process may be used to form the interconnects. The interconnects 414 may include copper.

Stage 13 illustrates a state after another dielectric layer 424 is formed over the dielectric layer 422. The dielectric layer 424 may be the same material as the dielectric layer 420. However, different implementations may use different materials for the dielectric layer. A deposition process and/or lamination process may be used to form the dielectric layer 424.

Stage 14 illustrates a state after a plurality of cavities 440 is formed in the dielectric layer 424. An etching process or laser process may be used to form the cavities 440. The plurality of cavities 440 may expose part of the interconnects 414.

Figure 4D:
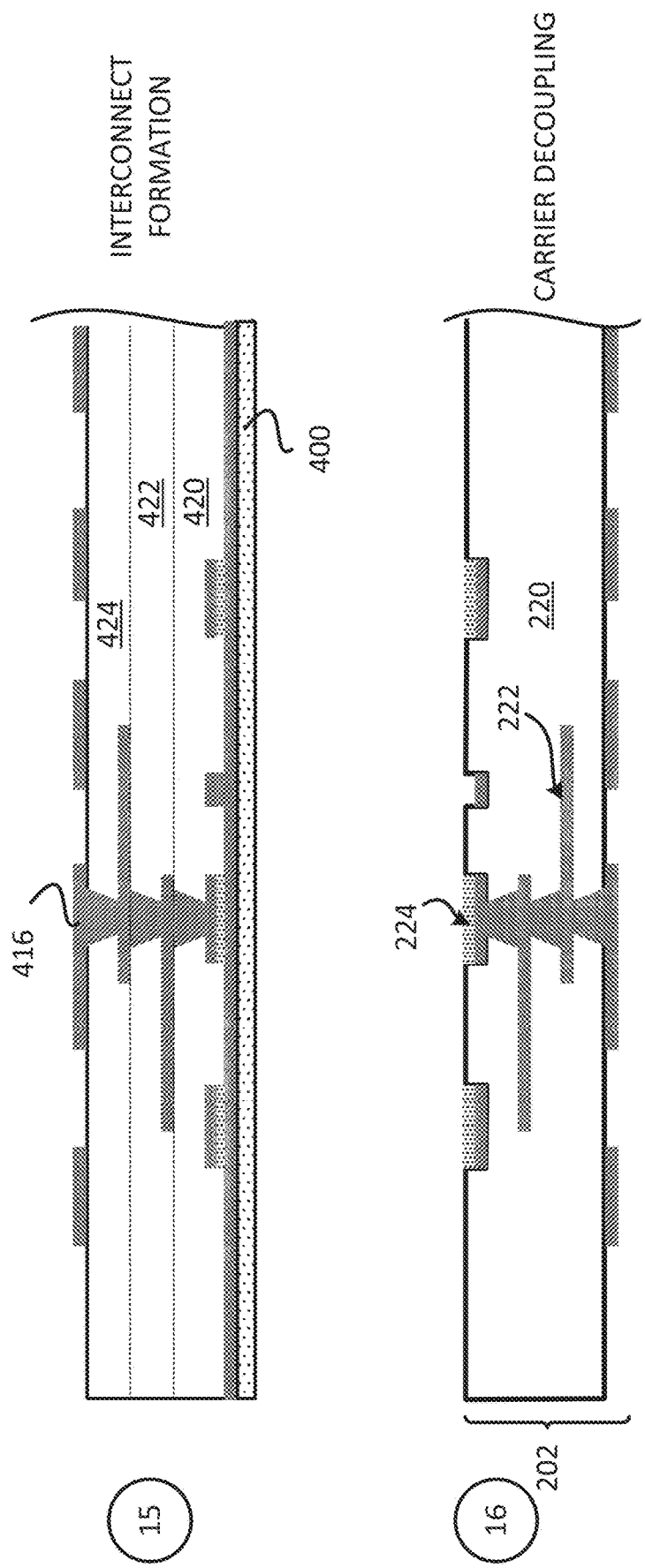

Stage 15, as shown in FIG. 4D, illustrates a state after interconnects 416 are formed in and over the dielectric layer 424. The interconnects 416 may be formed in the plurality of cavities 440. Examples of interconnects that may be formed include a via, pad and/or trace. A plating process may be used to form the interconnects. The interconnects 416 may include copper. The interconnects 416 may be formed over a surface of the dielectric layer 424. Thus, the interconnects 416 may be formed over a surface of a substrate.

Some or all of the interconnects 406, 412, 414 and/or 416 may define the plurality of interconnects 222 of the substrate 202. The dielectric layers 420, 422, 424 may be represented by the at least one dielectric layer 220.

Stage 16 illustrates a state after the carrier 400 is decoupled (e.g., removed, grinded out) from the dielectric layer 220 and the metal layer 402 (e.g., seed layer) is removed (e.g., etched) from the dielectric layer 220, leaving the substrate 202. At least one solder resist layer (e.g., 320) may be formed over a surface (e.g., top surface, bottom surface) of the substrate 202. The plurality of surface interconnects 224 is coupled to some of the plurality of interconnects 222 so that a surface (e.g., surface facing away from the substrate, surface facing an integrated device) of the plurality of surface interconnects 224 is planar and/or aligned with the surface of the substrate 202 (e.g., surface of the at least one dielectric layer 220). In some implementations, a surface interconnect 224 directly coupled to an interconnect 222 may be considered as a single pad interconnect comprising a first metal layer and a second metal layer, where the second metal layer includes a different material than a material of the first metal layer. The first metal layer may be represented by an interconnect from the plurality of interconnects 222, and the second metal layer may be represented by the surface interconnect 224. The first metal layer may include copper, and the second metal layer may include tin (Sn). The first meal layer may include a seed layer. As shown in stage 16, some of the interconnects from the plurality of plurality of interconnects 222 may be embedded through a surface of the substrate 202 and there may be a substrate recess over and/or adjacent to the some of the interconnects from the plurality of interconnects 222.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 5:
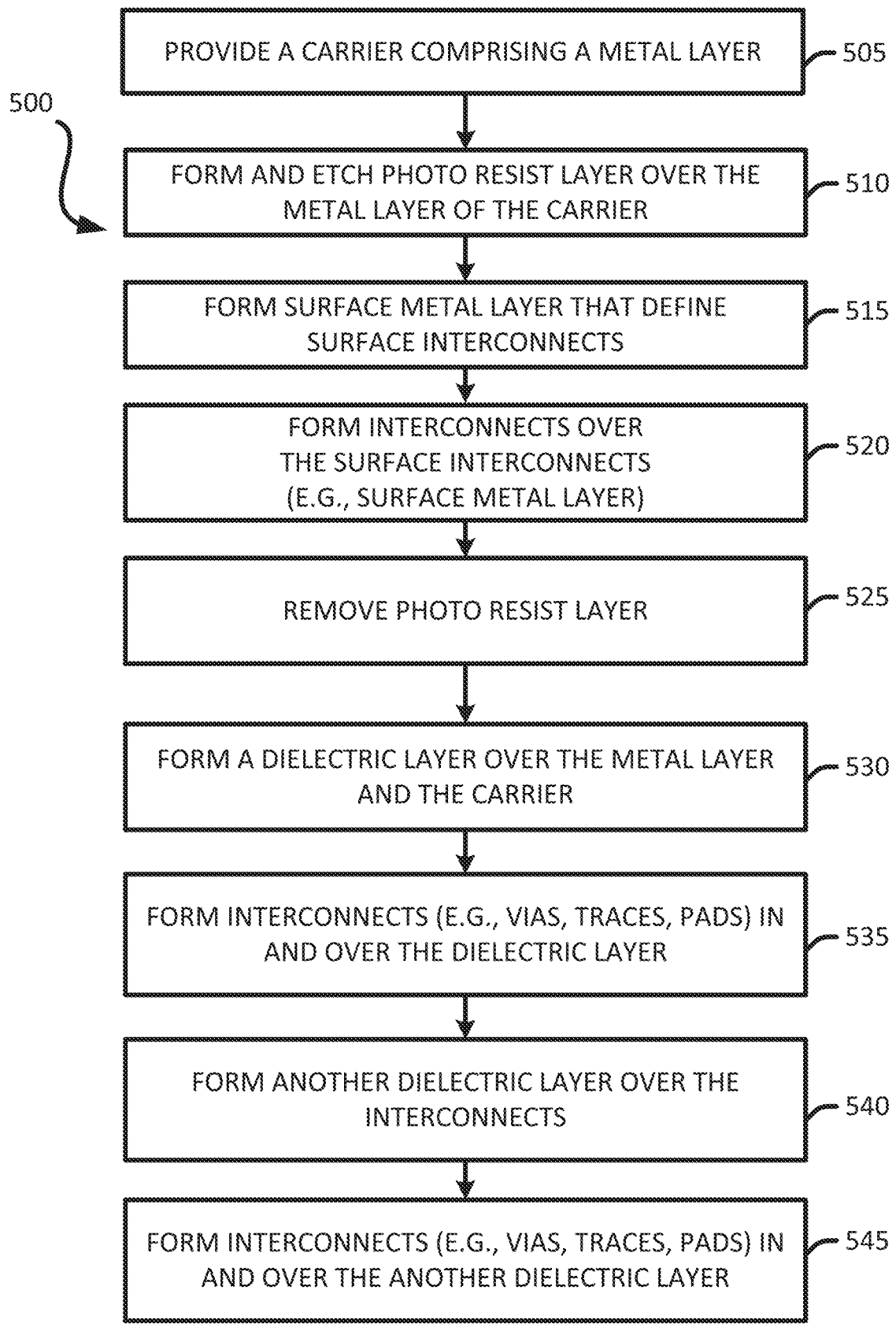
FIG. 5 illustrates an exemplary flow diagram of a method for fabricating a substrate.

In some implementations, fabricating a substrate includes several processes. FIG. 5 illustrates an exemplary flow diagram of a method 500 for providing or fabricating a substrate that includes surface interconnects. In some implementations, the method 500 of FIG. 5 may be used to provide or fabricate the substrate 202 of FIG. 2. However, the method 500 may be used to fabricate any substrate described in the disclosure.

It should be noted that the method of FIG. 5 may combine one or more processes in order to simplify and/or clarify the method for providing or fabricating a substrate. In some implementations, the order of the processes may be changed or modified.

The method provides (at 505) a carrier 400 with a metal layer 402. The metal layer 402 may include a seed layer (e.g., copper seed layer). Different implementations may use different materials for the carrier. Stage 1 of FIG. 10A illustrates and describes an example of a state after a carrier with a metal layer is provided.

The method forms and etches (at 510) a photo resist layer 403. The photo resist layer 403 may be laminated and/or deposited over the metal layer 402 of the carrier 400. Stages 2-3 of FIG. 10A illustrate and describe forming and etching a photo resist layer.

The method forms (at 515) a plurality of surface interconnects 224 over the metal layer 402. The surface interconnects 224 may be formed from a metal layer 405 (e.g., surface metal layer). A metal layer 405 may include a different material than the metal layer 402. The metal layer 405 may include tin (Sn). The metal layer 405 may be different from a seed layer (e.g., copper seed layer). A plating process may be used to form the metal layer 405. Stage 4 of FIG. 4A illustrates and describes an example of forming surface interconnects.

The method forms (at 520) interconnects 406 over the metal layer 405 and the metal layer 402. A plating process may be used to form the interconnects 406. Stage 5 of FIG. 4A illustrates and describes an example of forming interconnects.

The method removes (at 525) the photo resist layer 403. Stage 6 of FIG. 4B illustrates and describes an example of removing a photo resist layer.

The method forms (at 530) a dielectric layer 420 over the carrier 400 and the metal layer 402. The dielectric layer 420 may include polyimide. Forming the dielectric layer may also include forming a plurality of cavities (e.g., 410) in the dielectric layer 420. The plurality of cavities may be formed using an etching process (e.g., photo etching) or laser process. Stages 7-8 of FIG. 4B illustrate and describe an example of forming a dielectric layer and cavities in the dielectric layer.

The method forms (at 535) interconnects in and over the dielectric layer. For example, the interconnects 412 may be formed in and over the dielectric layer 420. A plating process may be used to form the interconnects. Forming interconnects may include providing a patterned metal layer over and/or in the dielectric layer. Stage 9 of FIG. 4B illustrates and describes an example of forming interconnects in and over a dielectric layer.

The method forms (at 540) a dielectric layer 422 over the dielectric layer 420 and the interconnects. The dielectric layer 422 may include polyimide. Forming the dielectric layer may also include forming a plurality of cavities (e.g., 430) in the dielectric layer 422. The plurality of cavities may be formed using an etching process or laser process. Stages 10-11 of FIGS. 4B-4C illustrate forming a dielectric layer and cavities in the dielectric layer.

The method forms (at 545) interconnects in and/or over the dielectric layer. For example, the interconnects 414 may be formed. A plating process may be used to form the interconnects. Forming interconnects may include providing a patterned metal layer over an in the dielectric layer. Stage 12 of FIG. 4C illustrates and describes an example of forming interconnects in and over a dielectric layer.

The method may form additional dielectric layer(s) and additional interconnects as described at 540 and 545. Stages 13-15 of FIGS. 4C-4D illustrate and describe an example of forming additional interconnects in and over a dielectric layer.

Once all the dielectric layer(s) and additional interconnects are formed, the method may decouple (e.g., remove, grind out) the carrier (e.g., 400) from the dielectric layer 420, and remove (e.g., etch out) the metal layer 402 (e.g., seed layer), leaving a substrate 202. Stage 16 of FIG. 4D illustrates and describes an example of decoupling a carrier from a substrate. In some implementations, the method may form at least one solder resist layer (e.g., 320) over the substrate (e.g., over first surface of the substrate, over second surface of the substrate).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 6A:
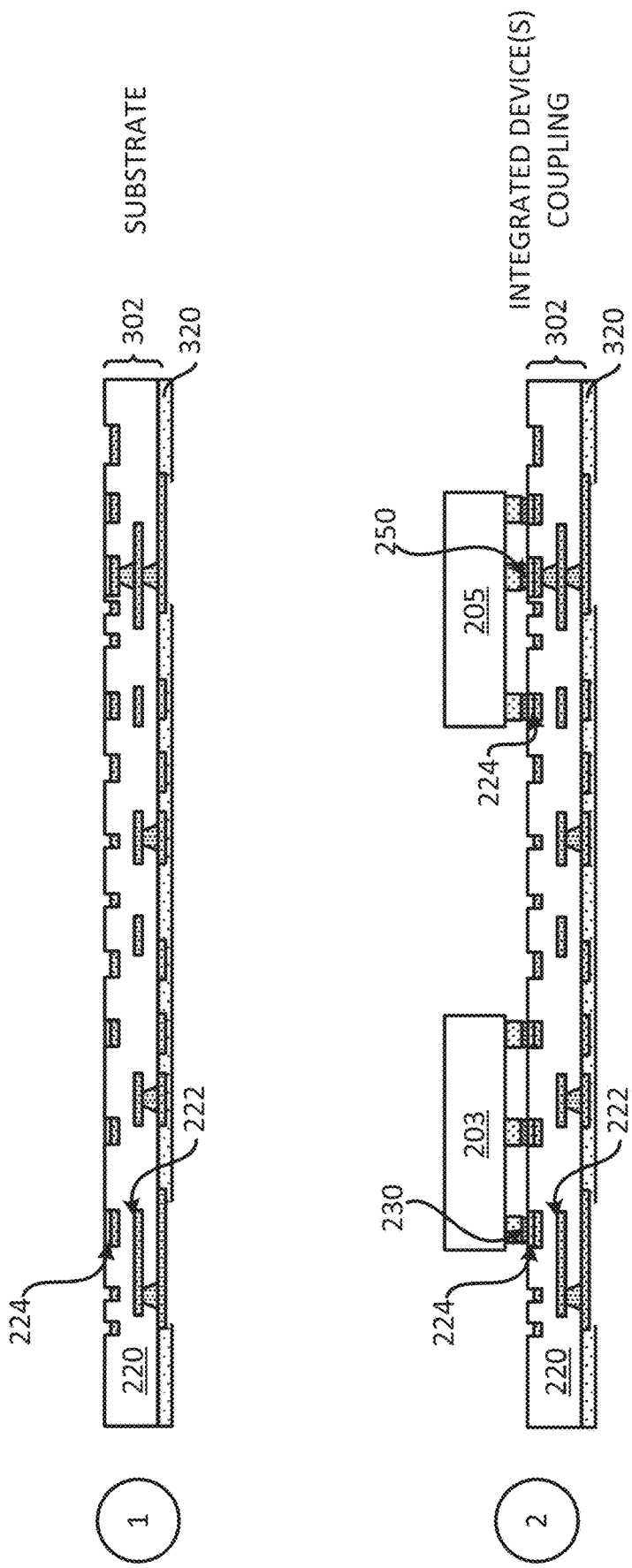
FIGS. 6A-6B illustrate an exemplary sequence for fabricating a package that includes a substrate comprising surface interconnects aligned with a surface of the substrate.
Figure 6B:
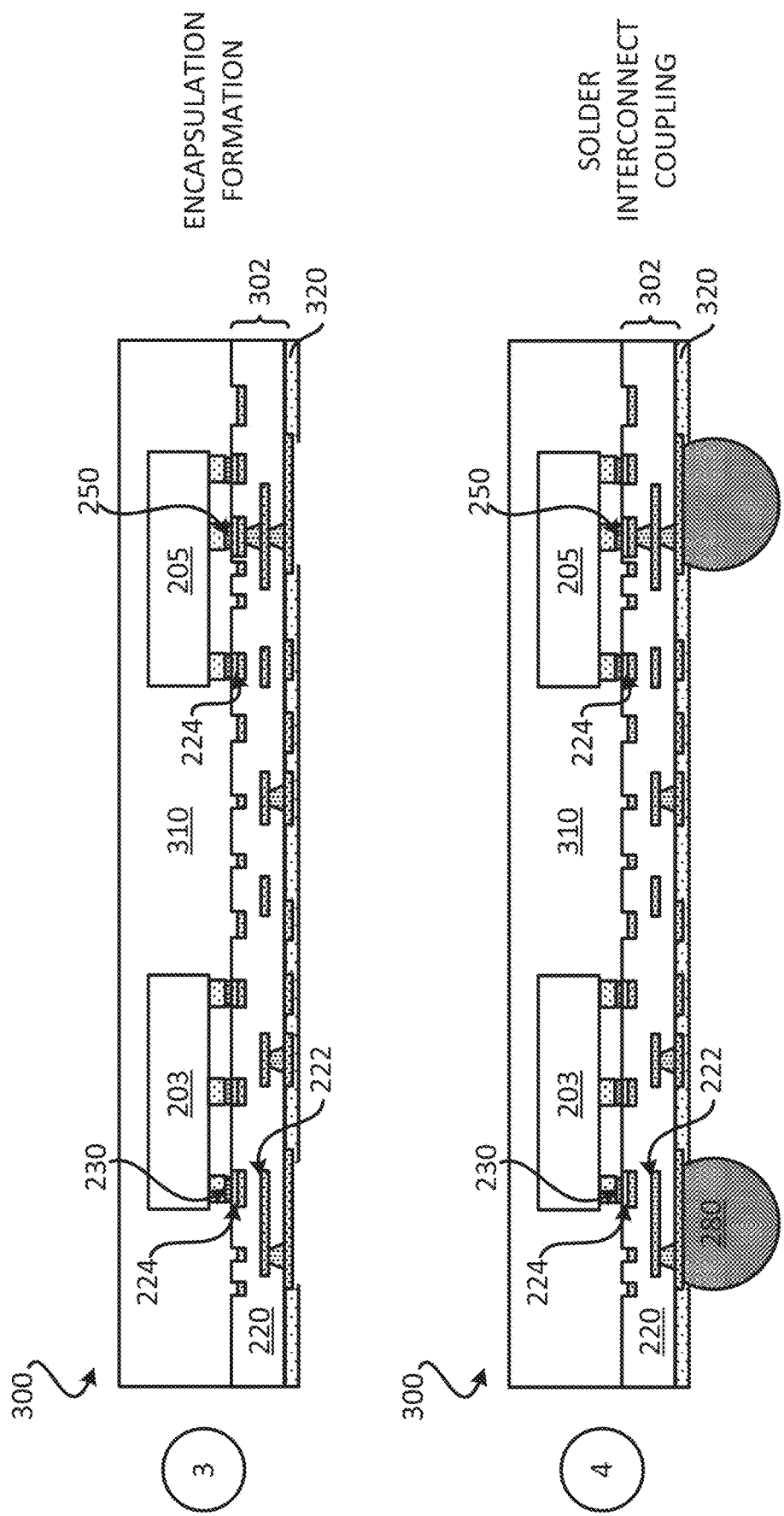

Exemplary Sequence for Fabricating a Package that Includes a Substrate Comprising Surface Interconnects FIGS. 6A-6B illustrate an exemplary sequence for providing or fabricating a package that includes a substrate comprising surface interconnects. In some implementations, the sequence of FIGS. 6A-6B may be used to provide or fabricate the package 300 that includes a substrate comprising surface interconnects of FIG. 3, or any of the packages described in the disclosure.

It should be noted that the sequence of FIGS. 6A-6B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 6A-6B may be used to fabricate one package or several packages at a time (as part of a wafer).

Stage 1, as shown in FIG. 6A, illustrates a state after a substrate 302 is provided. The substrate 302 may be provided by a supplier or fabricated. A process similar to the process shown in FIGS. 4A-4D may be used to fabricate the substrate 302. However, different implementations may use different processes to fabricate the substrate 302. Examples of processes that may be used to fabricate the substrate 302 include a semi-additive process (SAP) and a modified semi-additive process (mSAP). The substrate 302 includes at least one dielectric layer 220, a plurality of interconnects 222, a plurality of surface interconnects 224 and a solder resist layer 320. The substrate 302 may be an embedded trace substrate (ETS).

The plurality of surface interconnects 224 may have a surface that is aligned and/or planar with a surface (e.g., first surface, top surface) of the substrate 302. For example, a surface of the plurality of surface interconnects 224 that faces away from the substrate 302 is aligned and/or planar with the surface (e.g., first surface, top surface) of the substrate 302. In another example, a surface of the plurality of surface interconnects 224 that faces away from the substrate 302 is aligned and/or planar with the surface (e.g., first surface, top surface) of the at least one dielectric layer 220. The plurality of surface interconnects 224 may include a different material than a material of the plurality of interconnects 222. The plurality of interconnects 224 may be different than a seed layer.

Stage 2 illustrates a state after the integrated device 203 and the integrated device 205 are coupled to a first surface (e.g., top surface) of the substrate 302. The integrated device 203 may be coupled to the substrate 302 through a plurality of pillar interconnect 230 and a plurality of solder interconnects 232. The plurality of solder interconnects 232 may be coupled to the plurality of surface interconnects 224. The integrated device 205 may be coupled to the substrate 302 through a plurality of pillar interconnects 250 and a plurality of solder interconnects 252. The plurality of solder interconnects 252 may be coupled to the plurality of surface interconnects 224. A solder reflow process may be used to couple the integrated devices to the substrate 302.

Stage 3, as shown in FIG. 6B, illustrates a state after an encapsulation layer 310 is provided over the substrate 302 and the integrated devices (e.g., 203, 205). The encapsulation layer 310 may encapsulate the integrated devices(s) and/or the components. For example, an encapsulation layer 310 may be formed over the substrate 302 and the integrated device(s) (e.g., 203, 205). The encapsulation layer 310 may include a mold, a resin and/or an epoxy. A compression molding process, a transfer molding process, or a liquid molding process may be used to form the encapsulation layer 310. The encapsulation layer 310 may be photo etchable. The encapsulation layer 310 may be a means for encapsulation.

Stage 4 illustrates a state after the plurality of solder interconnects 280 is coupled to the second surface (e.g., bottom surface) of the substrate 302. The plurality of solder interconnects 280 may be coupled to interconnects from the plurality of interconnects 222 of the substrate 302. A solder reflow process may be used to couple the plurality of solder interconnects 280 to the substrate 302. Stage 4 may illustrate the package 300. The packages (e.g., 200, 300) described in the disclosure may be fabricated one at a time or may be fabricated together as part of one or more wafers and then singulated into individual packages.

Figure 7:
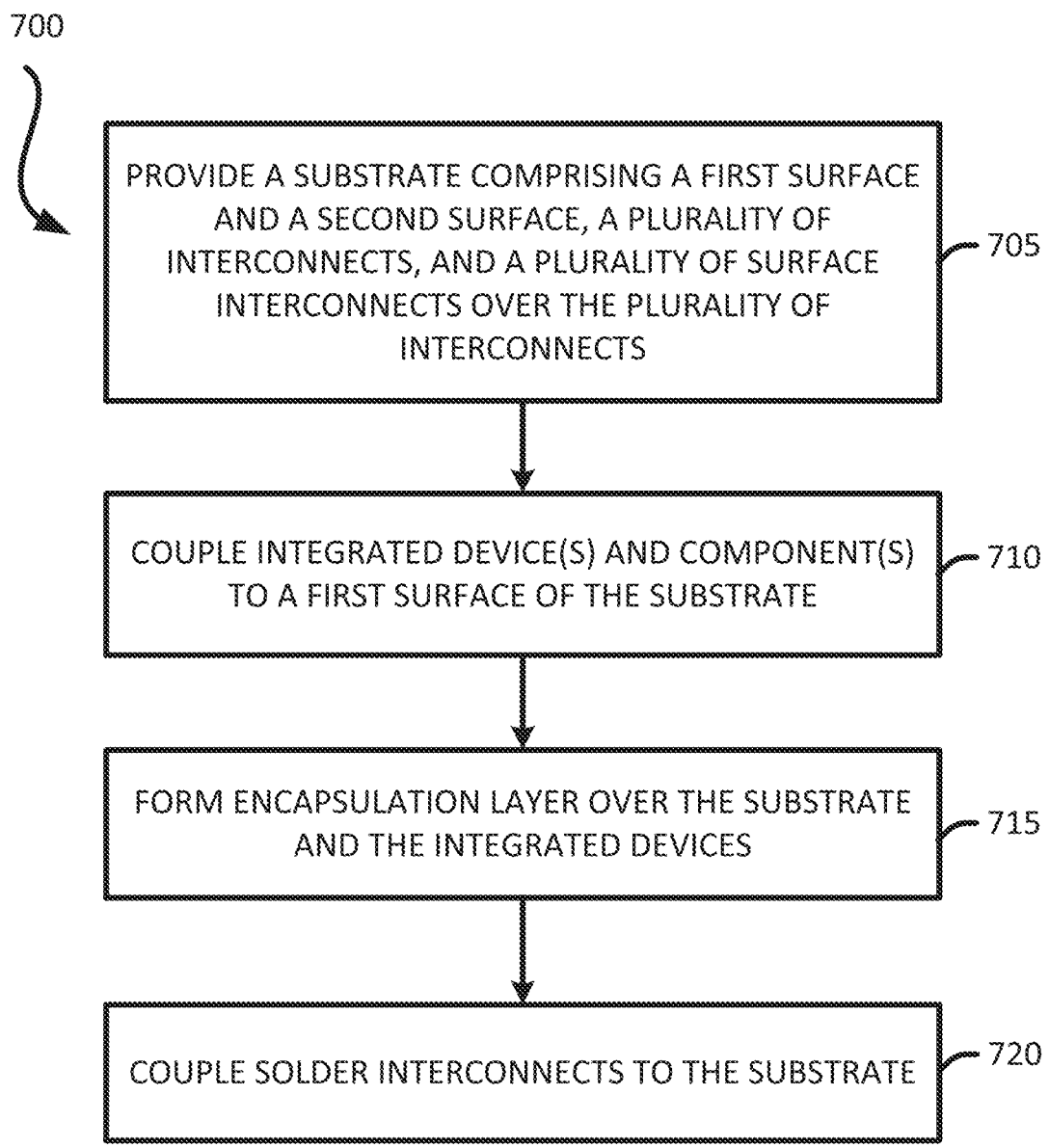
FIG. 7 illustrates an exemplary flow diagram of a method for fabricating a package that includes a substrate comprising surface interconnects aligned with a surface of the substrate.

Exemplary Flow Diagram of a Method for Fabricating a Package that Includes a Substrate Comprising Surface Interconnects In some implementations, fabricating a package that includes a substrate comprising surface interconnects includes several processes. FIG. 7 illustrates an exemplary flow diagram of a method 700 for providing or fabricating a package that includes a substrate comprising surface interconnects. In some implementations, the method 700 of FIG. 7 may be used to provide or fabricate the package 300 of FIG. 3 described in the disclosure. However, the method 700 may be used to provide or fabricate any of the packages described in the disclosure.

It should be noted that the method of FIG. 7 may combine one or more processes in order to simplify and/or clarify the method for providing or fabricating a package that includes a substrate comprising surface interconnects. In some implementations, the order of the processes may be changed or modified.

The method provides (at 705) a substrate (e.g., 202, 302) with surface interconnects. The substrate 302 may be provided by a supplier or fabricated. The substrate 302 includes a first surface and a second surface. The substrate 302 includes at least one dielectric layer 220, a plurality of interconnects 222, a plurality of surface interconnects 224 and a solder resist layer 320. The plurality of surface interconnect 224 may be coupled to the plurality of interconnects 222. The plurality of surface interconnect 224 may be located over the plurality of interconnects 222. Different implementations may provide different substrates. A process similar to the processes shown in FIGS. 4A-4D may be used to fabricate the substrate 302. However, different implementations may use different processes to fabricate the substrate 302. Stage 1 of FIG. 6A illustrates and describes an example of providing a substrate with surface interconnects.

The method couples (at 710) a plurality of integrated devices (e.g., 203, 205) to the first surface of the substrate (e.g., 302). For example, the integrated device 203 may be coupled to the substrate 202 through the plurality of pillar interconnects 230 and the plurality of solder interconnects 232. The plurality of solder interconnects 232 may be coupled to the plurality of interconnects 224 of the substrate 302. In another example, the integrated device 205 may be coupled to the substrate 302 through the plurality of pillar interconnects 250 and the plurality of solder interconnects 252. The plurality of solder interconnects 252 may be coupled to the plurality of surface interconnects 224 of the substrate 302. A solder reflow process may be used to couple integrated devices to a substrate. Stage 2 of FIG. 6A illustrates and describes an example of integrated devices coupled to a substrate.

The method forms (at 715) an encapsulation layer (e.g., 310) over the substrate (e.g., 302). The encapsulation layer 310 may include a mold, a resin and/or an epoxy. A compression molding process, a transfer molding process, or a liquid molding process may be used to form the encapsulation layer 310. The encapsulation layer 310 may be photo etchable. The encapsulation layer 310 may be a means for encapsulation. The encapsulation layer may encapsulate the integrated devices(s) and/or the components. Stage 3 of FIG. 6B illustrates and describes an example of forming an encapsulation layer over a substrate.

The method couples (at 720) a plurality of solder interconnects (e.g., 280) to the second surface of the substrate (e.g., 302). The plurality of solder interconnects may be coupled to a plurality of interconnects 222 of the substrate. Stage 4 of FIG. 6B, illustrates and describes an example of coupling solder interconnects to the substrate.

Exemplary Electronic Devices

Figure 8:
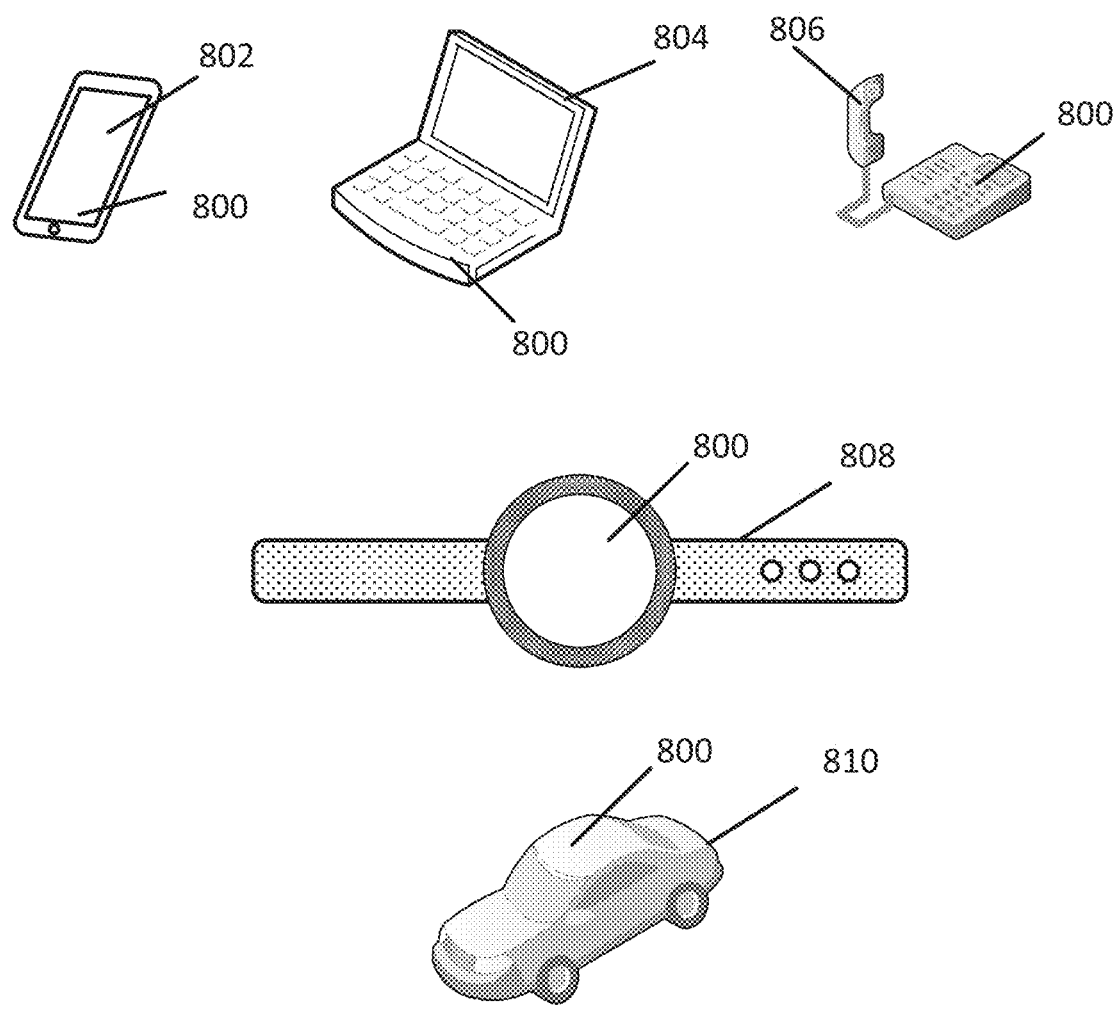
FIG. 8 illustrates various electronic devices that may integrate a die, an electronic circuit, an integrated device, an integrated passive device (IPD), a passive component, a package, and/or a device package described herein.

FIG. 8 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 802, a laptop computer device 804, a fixed location terminal device 806, a wearable device 808, or automotive vehicle 810 may include a device 800 as described herein. The device 800 may be, for example, any of the devices and/or integrated circuit (IC) packages described herein. The devices 802, 804, 806 and 808 and the vehicle 810 illustrated in FIG. 8 are merely exemplary. Other electronic devices may also feature the device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-3, 4A-4D, 5, 6A-6B, and/or 7-8 may be rearranged and/or combined into a single component, process, feature or function or embodied in several components, processes, or functions. Additional elements, components, processes, and/or functions may also be added without departing from the disclosure. It should also be noted FIGS. 2-3, 4A-4D, 5, 6A-6B, and/or 7-8 and its corresponding description in the present disclosure is not limited to dies and/or ICs. In some implementations, FIGS. 2-3, 4A-4D, 5, 6A-6B, and/or 7-8 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate and an integrated device. The substrate comprising at least one dielectric layer; a plurality of interconnects comprising a first material; and a plurality of surface interconnects coupled to the plurality of interconnects. The plurality of surface interconnects comprises a second material, and a surface of the plurality of surface interconnects is planar with a surface of the substrate. The integrated device is coupled to the plurality of surface interconnects of the substrate through a plurality of pillar interconnects and a plurality of solder interconnects.

Aspect 2: The package of aspect 1, wherein the plurality of surface interconnects includes a surface pad interconnect having a surface facing the integrated device, that is planar with the surface of the substrate.

Aspect 3: The package of aspects 1 through 2, wherein the plurality of surface interconnects is located between the plurality of interconnects and the integrated device.

Aspect 4: The package of aspects 1 through 3, wherein the plurality of surface interconnects is free of a seed layer.

Aspect 5: The package of aspects 1 through 4, wherein the plurality of surface interconnects includes tin (Sn).

Aspect 6: The package of aspects 1 through 5, wherein the plurality of interconnects includes a trace interconnect that is embedded in the substrate through the surface of the substrate, and wherein the trace interconnect is adjacent to a substrate recess from the surface of the substrate.

Aspect 7: The package of aspect 6, wherein the surface of the substrate is a surface that faces the integrated device.

Aspect 8: The package of aspects 1 through 7, wherein the plurality of interconnects includes a pad interconnect, wherein the plurality of surface interconnects includes a surface pad interconnect, wherein the surface pad interconnect is coupled to the pad interconnect, and wherein a surface of the pad interconnect facing the integrated device is planar with the surface of the substrate.

Aspect 9: The package of aspect 8, wherein the integrated device is coupled to the surface pad interconnect through a pillar interconnect and a solder interconnect.

Aspect 10: The package of aspects 1 through 9, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A substrate comprising at least one dielectric layer; a plurality of interconnects comprising a first material; and a plurality of surface interconnects coupled to the plurality of interconnects. The plurality of surface interconnects comprises a second material. A surface of the plurality of surface interconnects is planar with a surface of the substrate.

Aspect 12: The substrate of aspect 11, wherein the plurality of surface interconnects is free of a seed layer.

Aspect 13: The substrate of aspects 11 through 12, wherein the plurality of surface interconnects includes tin (Sn).

Aspect 14: The substrate of aspects 11 through 13, wherein the plurality of interconnects includes a trace interconnect that is embedded in the substrate through the surface of the substrate, and wherein the trace interconnect is adjacent to a substrate recess from the surface of the substrate.

Aspect 15: The substrate of aspect 14, wherein the surface of the substrate is a surface that faces the integrated device.

Aspect 16: The substrate of aspects 11 through 15, wherein the plurality of interconnects includes a pad interconnect, wherein the plurality of surface interconnects includes a surface pad interconnect, wherein the surface pad interconnect is coupled to the pad interconnect, and wherein a surface of the pad interconnect is planar with the surface of the substrate.

Aspect 17: A method for fabricating a package. The method provides a substrate comprising at least one dielectric layer; a plurality of interconnects comprising a first material; and a plurality of surface interconnects coupled to the plurality of interconnects, wherein the plurality of surface interconnects comprises a second material, and wherein a surface of the plurality of surface interconnects is planar with a surface of the substrate. The method couples an integrated device to the plurality of surface interconnects of the substrate through a plurality of pillar interconnects and a plurality of solder interconnects.

Aspect 18: The method of aspect 17, wherein the plurality of surface interconnects includes a surface pad interconnect having a surface facing the integrated device, that is planar with the surface of the substrate.

Aspect 19: The method of aspects 17 through 18, wherein the plurality of surface interconnects is located between the plurality of interconnects and the integrated device.

Aspect 20: The method of aspects 17 through 19, wherein the plurality of surface interconnects is free of a seed layer.

Aspect 21: The method of aspects 17 through 20, wherein the plurality of surface interconnects includes tin (Sn).

Aspect 22: The method of aspects 17 through 21, wherein the plurality of interconnects includes a pad interconnect, wherein the plurality of surface interconnects includes a surface pad interconnect, wherein the surface pad interconnect is coupled to the pad interconnect, and wherein a surface of the pad interconnect facing the integrated device is planar with the surface of the substrate.

Aspect 23: The method of aspect 22, wherein the integrated device is coupled to the surface pad interconnect through a pillar interconnect and a solder interconnect.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
    a substrate comprising:
        at least one dielectric layer;
        a plurality of interconnects comprising a first material,
            wherein the plurality of interconnects includes a via and a pad interconnect, and
            wherein the pad interconnect is coupled to and touching the via; and
        a plurality of surface interconnects coupled to the plurality of interconnects,
            wherein the plurality of surface interconnects comprises a second material,
            wherein the plurality of surface interconnects includes a surface pad interconnect,
            wherein the surface pad interconnect is coupled to and touching the pad interconnect,
            wherein the pad interconnect is located between the via and the surface pad interconnect, and
            wherein a surface of the plurality of surface interconnects is planar with a surface of the substrate, and
    an integrated device coupled to the plurality of surface interconnects of the substrate through a plurality of pillar interconnects and a plurality of solder interconnects.

2. The package of claim 1, wherein the surface pad interconnect comprises a surface facing the integrated device, that is planar with the surface of the substrate.

3. The package of claim 1, wherein the plurality of surface interconnects is located between the plurality of interconnects and the integrated device.

4. The package of claim 1, wherein the plurality of surface interconnects is free of a seed layer.

5. The package of claim 1, wherein the plurality of surface interconnects includes tin (Sn).

6. The package of claim 1,
    wherein the plurality of interconnects includes a trace interconnect that is embedded in the substrate through the surface of the substrate, and
    wherein the trace interconnect is adjacent to a substrate recess from the surface of the substrate.

7. The package of claim 6, wherein the surface of the substrate is a surface that faces the integrated device.

8. The package of claim 1, wherein the surface pad interconnect does not share a horizontal plane with any interconnect from the plurality of interconnects.

9. The package of claim 8, wherein the integrated device is coupled to the surface pad interconnect through a pillar interconnect and a solder interconnect.

10. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A substrate comprising:
    at least one dielectric layer;
    a plurality of interconnects comprising a first material,
        wherein the plurality of interconnects includes a via and a pad interconnect, and
        wherein the pad interconnect is coupled to and touching the via; and
    a plurality of surface interconnects coupled to the plurality of interconnects,
        wherein the plurality of surface interconnects comprises a second material,
        wherein the plurality of surface interconnects includes a surface pad interconnect,
        wherein the surface pad interconnect is coupled to and touching the pad interconnect,
        wherein the pad interconnect is located between the via and the surface pad interconnect, and
        wherein a surface of the plurality of surface interconnects is planar with a surface of the substrate.

12. The substrate of claim 11, wherein the plurality of surface interconnects is free of a seed layer.

13. The substrate of claim 11, wherein the plurality of surface interconnects includes tin (Sn).

14. The substrate of claim 11,
    wherein the plurality of interconnects includes a trace interconnect that is embedded in the substrate through the surface of the substrate, and
    wherein the trace interconnect is adjacent to a substrate recess from the surface of the substrate.

15. The substrate of claim 14, wherein the surface of the substrate is a surface that faces the integrated device.

16. The substrate of claim 11, wherein the surface pad interconnect does not share a horizontal plane with any interconnect from the plurality of interconnects.

* * * * *